United States Patent
Tutt et al.

(10) Patent No.: US 6,239,068 B1
(45) Date of Patent: May 29, 2001

(54) PROCESS FOR OBTAINING A DIFFUSION RESISTANT LENTICULAR ELEMENT

(75) Inventors: Lee W. Tutt, Webster; Christine M. Vargas, Churchville; John Agostinelli, Rochester, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/404,093

(22) Filed: Sep. 23, 1999

(51) Int. Cl.⁷ .............................. B41M 5/035; B41M 5/38
(52) U.S. Cl. .................. 503/201; 359/619; 430/645; 430/646; 503/218; 503/220; 503/227
(58) Field of Search .............................. 8/471; 359/619; 430/945, 946; 503/201, 218, 220, 227

(56) References Cited

U.S. PATENT DOCUMENTS

| | | | |
|---|---|---|---|
| 5,126,760 | 6/1992 | DeBoer | 346/108 |
| 5,168,094 | 12/1992 | Shuttleworth et al. | 503/227 |
| 5,177,052 | 1/1993 | Ambro et al. | 503/227 |

*Primary Examiner*—Bruce H. Hess
(74) *Attorney, Agent, or Firm*—Harold E. Cole

(57) ABSTRACT

A process of forming a diffusion resistant lenticular element comprising:

a) contacting at least one dye-donor element comprising a support having thereon a dye layer comprising an image dye in a binder having an infrared-absorbing material associated therewith, the image dye comprising a nonionic dye capable of being converted to a cationic dye by means of an acid, with a lenticular element comprising a first support having thereon a lenticular array on the opposite side thereof;

b) imagewise-heating the dye-donor element by means of a laser;

c) transferring a dye image to the first support of the lenticular element;

d) contacting the dye image with a mordanting element comprising a second support having thereon in order, a release layer and an adhesive layer of an acidic polymer having a Tg less than about 80° C., the adhesive layer of the mordanting element being in contact with the side of the first support which contains the dye image, forming a composite laminate;

e) heating the composite laminate to cause the nonionic dye to convert to a cationic dye which is mordanted in the adhesive layer and to cause the adhesive layer to adhere the mordanting element to the lenticular element; and f) removing the second support from the composite laminate, thus forming a diffusion resistant lenticular element.

12 Claims, No Drawings

PROCESS FOR OBTAINING A DIFFUSION RESISTANT LENTICULAR ELEMENT

CROSS REFERENCE TO RELATED APPLICATIONS

Reference is made to commonly-assigned copending U.S. patent application Ser. No. 09/404,564, filed of even date herewith pending, entitled "Diffusion Resistant Lenticular Element", of Tutt et al; and copending U.S. patent application Ser. No. 09/404,062, filed of even date herewith pending, entitled "Diffusion Resistant Lenticular Element", of Tutt et al; the teachings of which are incorporated herein by reference.

FIELD OF THE INVENTION

This invention relates to the laser printing of stereoscopic, multiple images or motion images which will be used in conjunction with a lenticular element.

BACKGROUND OF THE INVENTION

Lenticular arrays or overlays are a known means to give images the appearance of depth or motion. A lenticular image is created using a transparent upper layer having narrow parallel lenticules (half cylindrical lenses) on the outer surface and an image containing substrate or lower layer which projects images through the lenticules. The two layers form a lenticular system wherein each image is selectively visible as a function of the angle from which the system is viewed. A depth image is a composite picture made by bringing together into a single composition a number of different parts of a scene viewed from different angles. When the lenticules are vertically oriented, each eye of a viewer will see different elements and the viewer will interpret the net result as depth of field. The viewer may also move his head with respect to the image thereby observing other views with each eye and enhancing the sense of depth. Each lenticule is associated with a plurality of image lines or an image line set and the viewer is supposed to see only one image line (or view slice) of each set with each eye for each lenticule. It is imperative that the line image sets be registered accurately with the lenticules, so that the proper picture is formed when the assembly is viewed.

This process can be used to generate a three-dimensional effect at a proper viewing distance or multiple images by viewing from different angles. When the lenticules are oriented horizontally, each eye receives the same image. In this case, the multiple images upon moving the lenticular can be used to generate the illusion of motion. For whichever orientation the lenticules are oriented, each of the viewed images is generated by lines from an image which has been interlaced substantially at the frequency of the lenticular array, number of lenticules per length and with the desired number of images.

One method of recording of linear images on a lenticular recording material is accomplished with a stereoscopic image recording apparatus (hereunder referred to simply as "a recording apparatus") that relies upon optical exposure (printing). With this recording apparatus, original transmission images are projected from a light source. The light transmitted through the original images passes through the projection lenses of the recording apparatus to be focused on the lenticular recording material via a lenticular sheet. The original images are thereby exposed as linear images.

Another method of image recording uses scanning exposure which requires comparatively simple optics and yet has great flexibility in adapting to various image-processing operations and to alterations in the specifications of the lenticular sheet.

In the article entitled "Development of Motion Image Printer", by H. Akahori et al., IS&T 50th Annual Conference Proceedings, page 305, there is a disclosure of a printer for printing stereoscopic images using a thermal head and thermal dye transfer in registration with the lenticular material. The receiver sheet must be heated to achieve the necessary stability for registration of the images with the lenticular material. The resolution is six images on 100 DPI lenticular material with a 300 DPI thermal head. However, there is a problem with this method in that low resolution images are obtained, since heat transferred from the resistive head "spreads" through the support during printing.

EP 0 596 629A2 and EP 0 659 026A2 disclose a method and apparatus for directly printing on lenticular supports using lasers. This method generates an image in contact with the lenticular material. There is a problem with this method, however, in that the dyes can continue to migrate after transfer, resulting in unacceptable image ghosting (adjacent views bleeding through). In addition, if it is desired to add a reflective backing to the element, then trimming or a very accurate alignment is required.

An object of this invention is to provide a process for obtaining a high resolution lenticular image which is resistant to thermal dye diffusion. It is another object of this invention to provide a process for obtaining a high resolution lenticular image which is resistant to abrasion and does not require trimming or accurate alignment. Another object of the invention is to provide a process for obtaining a high resolution lenticular image which has a reflection layer underneath the image.

SUMMARY OF THE INVENTION

These and other objects of the invention are obtained in accordance with the invention which relates to a process of forming a diffusion resistant lenticular element comprising:

a) contacting at least one dye-donor element comprising a support having thereon a dye layer comprising an image dye in a binder having an infrared-absorbing material associated therewith, the image dye comprising a nonionic dye capable of being converted to a cationic dye by means of an acid, with a lenticular element comprising a first support having thereon a lenticular array on the opposite side thereof;

b) imagewise-heating the dye-donor element by means of a laser;

c) transferring a dye image to the first support of the lenticular element;

d) contacting the dye image with a mordanting element comprising a second support having thereon in order, a release layer and an adhesive layer of an acidic polymer having a Tg less than about 80° C., the adhesive layer of the mordanting element being in contact with the side of the first support which contains the dye image, forming a composite laminate;

e) heating the composite laminate to cause the nonionic dye to convert to a cationic dye which is mordanted in the adhesive layer and to cause the adhesive layer to adhere the mordanting element to the lenticular element; and f) removing the second support from the composite laminate, thus forming a diffusion resistant lenticular element.

By use of the invention, a high resolution lenticular image is generated efficiently which is resistant to thermal dye diffusion, has a high abrasion resistance and does not require trimming.

DESCRIPTION OF THE PREFERRED EMBODIMENTS

The support for the mordanting element used in the invention can include polyesters such as poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm.

As noted above, dyes useful in the invention are nonionic dyes capable of being converted to cationic dyes by means of an acid. A cationic dye diffuses much less readily than a nonionic dye due to electrostatic forces retarding movement. An example of an nonionic dye which converts to a cationic dye in the presence of an acid is the following (Since the chromophore is involved in the reaction, there is a color change indicating the state of the dye molecule):

Magenta → Cyan (Dye 1)

Examples of such dyes which may be used in the invention are of many classes. For example, the dye may be a deprotonated cationic dye which is capable of being reprotonated to a cationic dye having an N—H group which is part of a conjugated system. Additional examples of such dyes are disclosed in U.S. Pat. No. 5,523,274, the disclosure of which is hereby incorporated by reference, and include the following:

Dye 2

Dye 3

Dye 4

Dye 5

Another class of dyes useful in the invention is a pendant basic dye capable of being protonated to a cationic dye, as disclosed in U.S. Pat. Nos. 5,512,532, 5,744,422, and 5,804,531, the disclosures of which are hereby incorporated by reference. An example of a pendant basic dye which converts to a cationic dye in the presence of an acid is the following:

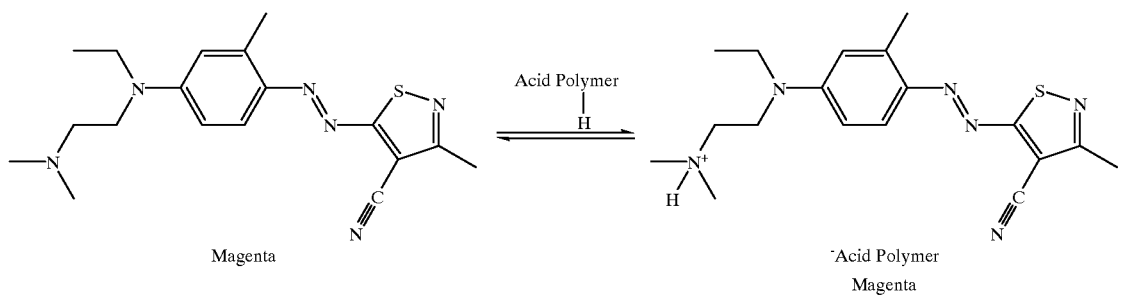

Additional examples of such dyes include the following:

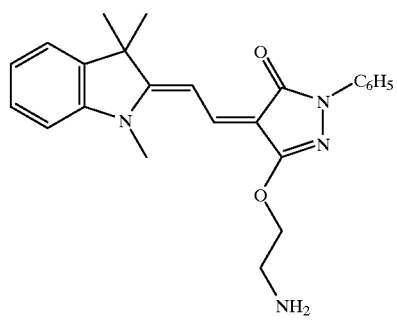

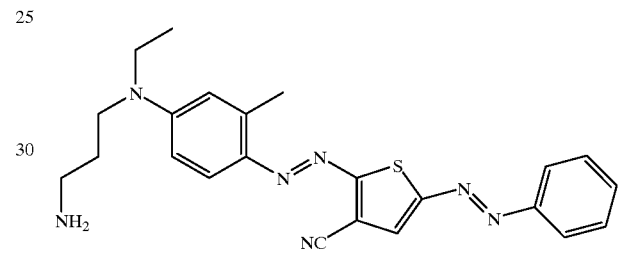

Another class of dyes useful in the invention is a lactone leuco dye capable of being protonated to a cationic dye, as disclosed in U.S. Pat. No. 5,830,823 and copending U.S. Ser. No. 08/996,388, the disclosures of which are hereby incorporated by reference. An example of a lactone leuco dye which converts to a cationic dye in the presence of an acid is the following:

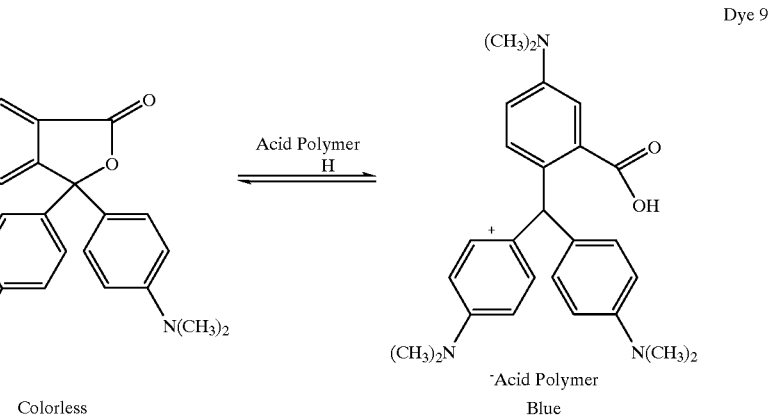

An additional example of such dyes includes the following:

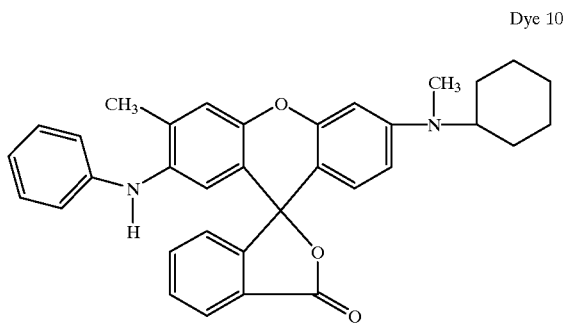

Dye 10

Another class of dyes useful in the invention is a carbinol dye capable of being protonated to a cationic dye, as disclosed in U.S. Pat. No. 5,804,531, the disclosure of which is hereby incorporated by reference. An example of a carbinol dye which converts to a cationic dye in the presence of an acid is the following:

resistance, rigidity, ink receptivity for backside printing and prevention of the adhesive layer from sticking to an undesired surface.

Between the release layer and the acidic adhesive polymer there may be located one or more interlayers to give reflection capability, strength, extra abrasion resistance, or rigidity. These layers may be a polymeric binder containing reflective materials such as $TiO_2$, barium sulfate, hollow beads, etc. In a preferred embodiment of the invention, separation occurs at the interface between the release layer and its support. Thus, the lenticular element will have a reflection layer located between the acidic adhesive polymer and the release layer.

The dyes of the dye-donor element used in the invention can optionally be dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; polyvinyl butyrate; copolymers of maleic anhydride with vinyl ethers such as methyl vinyl ether; polycyanoacrylates; a polycarbonate; poly(vinyl acetate); poly(styrene-co-acrylonitrile); a polysulfone or a poly(phenylene oxide), gelatin, etc. The binder may be used at a coverage of from about 0.1 to about 5 $g/m^2$.

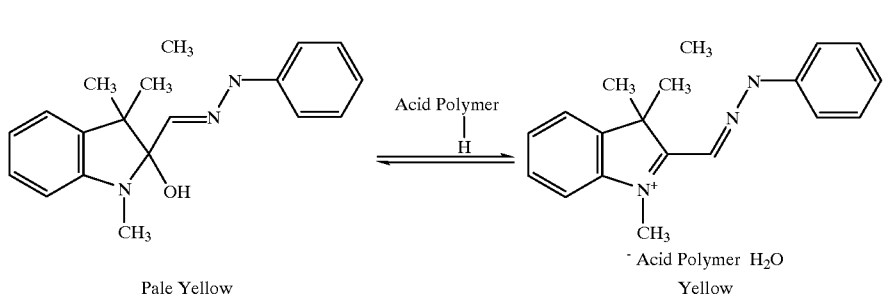

Dye 11

Pale Yellow      Yellow

As noted above, the adhesive layer of an acidic polymer used in the invention has a Tg less than about 80° C. If the Tg is greater than 80° C., then low or very little adhesion of the lenticular element to the protective element is obtained. Examples of acidic adhesive polymers useful in the invention include condensation polymers such as polyesters, polyurethanes, polycarbonates, etc.; addition polymers such as polystyrenes, vinyl polymers, etc.; and copolymers of more than one type of monomer covalently linked together, provided such polymeric material contains acid groups as part of the polymer chain. In a preferred embodiment of the invention, the acidic adhesive comprises an acrylic polymer, an olefinic polymer, an olefin acrylic copolymer, a sulfopolyester or a styrenic polymer. The adhesive layer can be used at a coverage of from about 0.1 to about 10 $g/m^2$.

The release layer used in the invention can be any polymer which will enable the lenticular element to separate from the support of the mordanting element. The release can occur at the interface of the release layer and the support, within the release layer itself, or at the interface of the release layer and the next adjacent layer. In a preferred embodiment of the invention, the release occurs at the interface of the release layer and the support.

Examples of release layers which can be used in the invention include hydroxyethyl cellulose, gelatin, polyvinylbutyral, etc. The release layer may be used at a coverage from about 0.2 to about 10 $g/m^2$. In embodiments where the release layer remains with the lenticular element, the release layer can provide additional strength, abrasion Any material can be used as the support for the lenticular array of the invention provided it is dimensionally stable. Such materials include polyesters such as poly(ethylene terephthalate); polyamides; polycarbonates; cellulose esters such as cellulose acetate; fluorine polymers such as poly (vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyetherimides. The support generally has a thickness of from about 50 to about 5000 μm. While the lenticular array may be provided on a separate support, generally the support and the array are in one integral element.

Infrared-absorbing materials which may be used in the invention include carbon black, cyanine infrared-absorbing dyes as described in U.S. Pat. No. 4,973,572, or other materials as described in the following U.S. Pat. Nos. 4,948,777; 4,950,640; 4,950,639; 4,948,776; 4,948,778; 4,942,141; 4,952,552; 5,036,040; and 4,912,083, the disclosures of which are hereby incorporated by reference.

A laser is used to transfer dye from the dye-donor element used in the invention. It is preferred to use a diode laser since it offers substantial advantages in terms of its small size, low cost, stability, reliability, ruggedness, and ease of modulation Lasers which can be used to transfer dye from dye-donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in U.S. Pat. No. 5,268,708, the disclosure of which is hereby incorporated by reference.

Spacer beads may be employed in a separate layer over the dye layer of the dye-donor element in the above-described laser process in order to separate the donor from the receiver during dye transfer, thereby increasing the uniformity and density of the transferred image. That invention is more fully described in U.S. Pat. No. 4,772,582, the disclosure of which is hereby incorporated by reference. Alternatively, spacer beads may be employed in the receiving layer of the receiver as described in U.S. Pat. No. 4,876,235, the disclosure of which is hereby incorporated by reference. The spacer beads may be coated with a polymeric binder if desired.

As noted above, in the process of the invention, the lenticular element with the transferred dye is heated to cause the nonionic dye to convert to a cationic dye which is mordanted in the adhesive layer and to cause the adhesive layer to adhere the mordanting element to the lenticular element. This heating may be accomplished, for example by passing the element between a pair of heated rollers. Other methods of heating could also be used such as using a heated platen, use of pressure and heat, external heating, etc.

During the heating step, the adhesive layer contacts the lenticular element and only adheres in the desired area. Upon separation of the mordanting element support from the composite laminate, areas of the mordanting element which was not in contact with the lenticular element maintain their integrity. In areas of the mordanting element which was in contact with the lenticular element, the release layer allows separation without the need for a separate trimming step.

The following examples are provided to illustrate the invention.

EXAMPLES

Example 1

Dye Donor Element 1

The donor element was coated with a laydown of 0.22 g/m$^2$ carbon black, Cabot Black Pearls 700® (Cabot Corp.), 0.54 g/m$^2$ polyvinylbutyral, (Butvar® 76, Monsanto Co.), 0.01 g/m$^2$ Fluorad FC 431® surfactant (3M Co.), 0.02 g/m$^2$ crosslinked polydivinylbenzene beads, 5.4 µm, and 0.54 g/m$^2$ of Dye 1 (illustrated above) from methyl isobutyl ketone on a 104 µm thick poly(ethylene terephthalate) support.

Dye Donor Element 2

The donor element was the same as Dye Donor Element 1 except that it contained Dye 6 (illustrated above).

Mordanting Element 1 of the Invention

A 36 µm thick poly(ethylene terephthalate) support was coated with a release layer of polyvinylbutyral, (Butvar® 76, Monsanto Co.), 0.108 g/cm$^2$, from acetone. On top of said release layer was coated a mordanting adhesive layer of an aqueous coating of 3.24 g/m$^2$ of the ammonia salt of poly{isophthalic acid-co-5-sulfoisophthalic acid (90:10 molar ratio)-diethylene glycol (100 molar ratio)}, MW=20,000 (ammonium salt of AQ29D, Eastman Chemical Co.) and 0.02 g/m$^2$ Dispex N-40® surfactant (Ciba Specialty Chemicals).

Mordanting Element 2 of the Invention

This element was the same as Mordanting Element 1 of the Invention except that between the release layer and the mordanting adhesive layer was coated a reflective layer of an aqueous coating of TiO$_2$ (R706, Dupont Inc), 32.4 g/cm$^2$, and an aqueous coating of 3.24 g/m$^2$ of the ammonia salt of poly{isophthalic acid-co-5-sulfoisophthalic acid (90:10 molar ratio)diethylene glycol (100 molar ratio)}, MW=20,000 (ammonium salt of AQ29D, Eastman Chemical Co.) and 0.02 g/m$^2$ Dispex N-40® surfactant (Ciba Specialty Chemicals).

Mordanting Element 3 of the Invention

This element was the same as Mordanting Element 1 of the Invention except that the release layer was hydroxyethyl cellulose (0.32 g/m$^2$) and 10 G surfactant (Olin Corp.) (0.03 g/cm$^2$) and the mordanting adhesive layer was an ethylene/acrylic acid (15% acrylic acid) copolymer (1.62 g/m$^2$) (Scientific Polymer Products Inc.) from tetrahydrofuran.

Mordanting Element 4 of the Invention

This element was the same as Mordanting Element 1 of the Invention except that the release layer was gelatin (1.08 g/m$^2$), 10 G surfactant (Olin Corp.) (0.011 g/cm$^2$) and bis(vinylsulphonyl)methane, (0.022 g/cm$^2$).

Mordanting Element 5 of the Invention

This element was the same as Mordanting Element 3 of the Invention except that the release layer was gelatin (1.08 g/m$^2$), 10 G surfactant (Olin Corp.) (0.011 g/cm$^2$) and bis(vinylsulphonyl)methane, (0.022 g/cm$^2$).

Control 1 Mordanting Element

This element was the same as Mordanting Element 1 of the Invention except that there was no release layer.

Control 2 Mordanting Element

This element was the same as Mordanting Element 3 of the Invention except that there was no release layer.

Lenticular Array

A polycarbonate lenticular material which consisted of cylindrical lenses on one face and a flat rear face was used. This lenticular material had a pitch of 1.973 lines/mm and a thickness of 1.27 mm. The lens curvature was such that focus was on the rear of the lenticular material.

Printing

A dye-donor element was placed dye side to flat rear side of the lenticular array and vacuum was applied to hold the donor to the array. Printing was accomplished using an SDL 23-S9781 1 watt c-mount laser diode (Spectra Diode Labs, Inc.). Approximately 700 mw was delivered to the element in a spot approximately 13 µm by 80 µm using the technique of beam folding as disclosed in copending application U.S. Ser. No. 09/175,735 of Kessler, filed Oct. 20, 1998. Scanning of the spot was accomplished using a galvanometer with the beam oriented with the long axis parallel to the scan direction as described in the copending application U.S. Ser. No. 09/128,077, of Kessler et al., filed Aug. 3, 1998. Dwell time was approximately 9 microseconds.

A target image was written onto the back of the donor causing the donor dye to be transferred to the lenticular material. The resulting image was magenta.

Mordanting of the dyes and lamination of the mordanting element was accomplished by passing the card through a laminator with the adhesive layer of the mordanting element in contact with the flat side of the lenticular array. The lamination was conducted with a feed rate of 0.36 cm/sec at a temperature of 133° C. The laminator was a modified GMP Co. LTD (Kyoungki-Do, Korea) laminator model Passport-175LSI. The modification was to adjust the gap thickness to accommodate the 1270 µm lenticular material and the lower roller heating was disabled.

The support was then peeled from the back of the lenticular material. The peeling was evaluated as to difficulty and as to whether the dye image on the lenticular support was removed, which is undesirable. The following results were obtained:

TABLE

| Mordanting Element | Peelability | Dye Image Removal |
|---|---|---|
| 1 | Good | None |
| 2 | Good | None |
| 3 | Good | None |
| 4 | Good | None |
| 5 | Good | None |
| Control 1 | Poor/Support tore | Some |
| Control 2 | Poor | Complete |

The above results show that the mordanting elements of the invention peeled easily and did not cause any of the image dye layer to be removed, in contrast to the control elements The invention has been described in detail with particular reference to preferred embodiments thereof, but it will be understood that variations and modifications can be effected within the spirit and scope of the invention.

What is claimed is:

1. A process of forming a diffusion resistant lenticular element comprising:

a) contacting at least one dye-donor element comprising a support having thereon a dye layer comprising an image dye in a binder having an infrared-absorbing material associated therewith, said image dye comprising a nonionic dye capable of being converted to a cationic dye by means of an acid, with a lenticular element comprising a first support having thereon a lenticular array on the opposite side thereof;

b) imagewise-heating said dye-donor element by means of a laser;

c) transferring a dye image to said first support of said lenticular element;

d) contacting said dye image with a mordanting element comprising a second support having thereon in order, a release layer and an adhesive layer of an acidic polymer having a Tg less than about 80° C., said adhesive layer of said mordanting element being in contact with the side of said first support which contains said dye image, forming a composite laminate;

e) heating said composite laminate to cause said nonionic dye to convert to a cationic dye which is mordanted in said adhesive layer and to cause said adhesive layer to adhere said mordanting element to said lenticular element; and f) removing said second support from said composite laminate, thus forming a diffusion resistant lenticular element.

2. The process of claim 1 wherein said second support is removed at the interface of said release layer and said second support, thus forming a diffusion resistant lenticular element having said release layer on the side opposite to that of said lenticular array.

3. The process of claim 1 wherein said second support is poly(ethylene terephthalate).

4. The process of claim 3 wherein said release layer is polyvinylbutyral, hydroxyethylcellulose or gelatin.

5. The process of claim 1 wherein said release layer is ink-receptive.

6. The process of claim 1 wherein said mordanting element contains a reflective interlayer between said release layer and said adhesive layer.

7. The process of claim 6 wherein said reflective interlayer contains $TiO_2$.

8. The process of claim 1 wherein said adhesive layer is an acrylic polymer, an olefinic polymer, a sulfopolyester or a styrenic polymer.

9. The process of claim 1 wherein said cationic dye is a protonated cationic dye having a N—H group which is part of a conjugated system.

10. The process of claim 1 wherein said cationic dye is a protonated pendant basic dye.

11. The process of claim 1 wherein said cationic dye is a protonated lactone leuco dye.

12. The process of claim 1 wherein said cationic dye is a protonated carbinol dye.

* * * * *